Dec. 8, 1970 F. W. SCHNEBLE, JR., ET AL 3,546,009

METALLIZATION OF INSULATING SUBSTRATES

Filed Jan. 3, 1967 2 Sheets-Sheet 1

INVENTORS
FREDERICK W. SCHNEBLE, JR.
EDWARD JOHN LEECH
JOHN FRANCIS McCORMACK

BY
MORGAN, FINNEGAN, DURHAM & PINE

ATTORNEYS

INVENTORS
FREDERICK W. SCHNEBLE, JR.
EDWARD JOHN LEECH
JOHN FRANCIS McCORMACK

BY
MORGAN, FINNEGAN, DURHAM & PINE

ATTORNEYS

United States Patent Office 3,546,009

Patented Dec. 8, 1970

3,546,009

METALLIZATION OF INSULATING SUBSTRATES

Frederick W. Schneble, Jr., Oyster Bay, Edward John Leech, Oyster Bay, and John Francis McCormack, Roslyn Heights, N.Y., assignors to Photocircuits Division of Kollmorgen Corporation, Hartford, Conn., a corporation of New York Filed Jan. 3, 1967, Ser. No. 606,918

Int. Cl. B44d *1/14, 1/34*

U.S. Cl. 117—212 18 Claims

ABSTRACT OF THE DISCLOSURE

A new insulating base is provided which has incorporated therein a catalytic filler which comprises inert, finely divided solid particles of a base exchangeable material which contains a cation of a metal selected from Groups I–B and VIII of the Periodic Table of Elements, such metal cation being chemisorbed on the exchangeable material in place of replaceable cations present in such material.

This invention relates to materials and techniques for metallizing insulating substrates generally and for the manufacture of printed circuit particularly.

It is an object of the present invention to provide new and improved insulating blanks which are catalytic to the reception of electroless metal and which can be metallized directly, thereby obviating the necessity for seeding and/or sensitizing.

Another object of this invention is to make rugged and durable metallized objects from such catalytic insulating blanks.

A further object of this invention is to make printed circuit boards from such blanks, including one-layer, two-layer and multilayer boards.

A further object of this invention is to make from such blanks printed circuit boards, including one-layer, two-layer and multilayer boards, which are provided with conductive passageways.

An additional object of this invention is to provide materials and techniques for producing high density printed circuit boards, including high density one-layer, two-layer and multilayer boards which are provided with conductive passageways, or, as more commonly referred to, plated through holes.

Still a further object of this invention is to provide materials and techniques for producing new and improved printed circuit armatures.

Heretofore, in the manufacture of printed circuit boards comprising conductive passageways or holes through insulating panels, it has been customary to seed and sinsitize the lateral walls surrounding the passageways or holes by contacting a perforated substratum sequentially with aqueous acidic solutions of stannous tin ions and precious metal ions, e.g., palladium, or with a single acidic aqueous solution comprising a mixture of stannous tin ions and precious metal ions, such as palladium ions. For example, one such treatment involves immersing the perforated insulating base material first in an aqueous solution of stannous chloride having a pH of about 6.6 to 7.4, followed by washing, after which the substratum is immersed in an acidic aqueous solution of palladium chloride having a pH of about 4.8 to 5.4. In an alternate system, the perforated substratum is simply immersed in a one-step seeder sensitizer acidic aqueous solution comprising a mixture of stannous chloride and palladium chloride.

Such aqueous seeding and sensitizing solutions have important limitations. Hydrophobic plastics cannot be readily wetted with such solutions and therefore the sensitization achieved with such materials is ordinarily less than satisfactory. When such aqueous seeding and sensitizing solutions are utilized to sensitize lateral walls of the holes or passageways in panels provided with metal foil on one or more surfaces of the panel, the bond between the hole plating and the surface foil tends to be weak. This is so because use of such seeding and sensitizing systems result in depositing a seeder layer on the surface foil, including the edges thereof which surround the holes. This seeder layer interferes with the bond between the surface foil edges surrounding the holes and electroless metal deposited simultaneously on the edges and on the walls surrounding the holes. It is also frequently necessary to superimpose additional metal on the foil adhered directly to the substratum for a variety of reasons. Thus, the initial foil may not be thick enough for the desired printed circuit component and additional metal may therefore have to be added to thicken the pattern. Alternatively, it is frequently necessary to superimpose on the metal cladding a layer of a different metal in order to impart special characteristics to the circuit. Typically, metals such as nickel, gold, silver and rhodium, including mixtures of such metals, are electroplated or electrolessly deposited on an initial layer of copper foil or cladding during the manufacture of printed circuits from copper clad laminates. When the aqueous seeding and sensitizing solutions of the type described are utilized in the manufacture of such circuits, the bond between the copper and the metal subsequently superimposed on the copper also tends to be weak. Here again, the weakness is attributable to the intermediate seeder layer formed on the metal cladding by the seeder-sensitizer solutions of the type described.

As will be clear from the following description, use of the catalytic blanks and compositions of the present invention eliminates the need for such conventional seeding and/or sensitizing solutions and therefore eliminates the problems concomitant with the use thereof. Very importantly, use of the catalytic blanks and compositions of this invention insures a strong bond between the laminate foil bonded to the catalytic blank and electroless metal deposited on the blank, e.g., on walls surrounding holes, since no intermediate seeder layer is present to interfere with the bond. Also important is the fact that use of these catalytic blanks and compositions leads to the achievement of uniformly high bond strengths between the insulating substream itself and the electroless metal deposit.

Other objects and advantages of the invention will be set forth in part herein and in part will be obvious herefrom or may be learned by practice with the invention, the same being realized and attained by means of the instrumentalities and combinations pointed out in the appended claims.

The invention consists in the novel parts, constructions, arrangements, combinations and improvements herein shown and described. The accompanying drawings referred to herein and constituting a part hereof, illustrate certain embodiments of the invention and together with the specification serve to explain the principles of the invention.

The compositions of the present invention represent an improvement over the seeding and/or sensitizing systems heretofore employed. They are extremely easy to prepare, are readily responsive to deposition when exposed to electroless metal baths; are adaptable to a wide variety of substrata and processing conditions; and are also quite economical.

Very importantly, the compositions of this invention utilize relatively small amounts of catalytic metals of Groups I–B and VIII of the Periodic Table of Elements and thus permit efficient utilization of such metals generally, and the precious metals in those groups particularly.

The seeding systems of the present invention are also nonconducting in nature thereby rendering them highly useful for making printed circuits by both positive and negative print techniques.

The catalytic compositions of the present invention comprise a metal selected from Groups I–B or VIII of the Periodic Table of Elements which is catalytic to the reception of electroless metal. Preferred metals from the aforesaid groups are gold, silver, platinum, palladium, rhodium, tin, copper and iridium.

According to the present invention, insulating compositions catalytic to the reception of electroless metal are prepared by base exchanging certain natural and synthetic materials which contain replaceable cations (e.g., alkali and alkaline earth metal cations, ammonium and the like), with a metal catalytic to the reception of electroless metal, and then utilizing the resulting base exchanged material as a component of the insulating base desired to be metallized.

Among the base exchangeable materials which may be used are organic and inorganic base exchangeable materials. When such materials are base exchanged with cations of the metals of Group I–B or VIII, in accordance with the teachings hereof, the original replaceable cations thereof are replaced by a cation of a Group I–B or VIII metal, thereby rendering the resulting material catalytic to the reception of electroless metal. It will be understood that following base exchange, the cation of a Group I–B or VIII metal will be chemisorbed on the exchangeable material, i.e., it will be bonded to the exchangeable material in a chemical as distinguished from a physical sense.

Typical of the inorganic base exchangeable materials are suitable clay minerals such as montmorillonite, viz., sodium, potassium, calcium, ammonium and other bentonite clays; hectorite; saponite; attapulgite, illite; vermiculite and zeolites. These minerals, characterized by an unbalanced crystal lattice have negative charges which are normally neutralized by inorganic cations, usually of alkali metals, alkaline earth metals, or ammonium.

The base exchange capacities of the various clay minerals enumerated run from about 15 to about 150, based upon milliequivalents of exchangeable base per 100 grams of clay. The montmorillonite and vermiculite minerals have high base exchange capacities, e.g., 80–100 and 100–150, respectively. Attapulgite has a comparatively high base exchange capacity, e.g., 20–30. Generally, clay minerals which have a base exchange capacity, of at least 15, are useful in practicing the present invention.

Also suitable for use in the practice of this invention are synthetic and naturally occurring crystalline metal aluminosilicates, sometimes referred to as molecular sieves or crystalline zeolites.

Crystalline metal aluminosilicates are found widely scattered in nature in relatively small quantities. Synthetic forms of the naturally occurring minerals, as well as many species having no known natural counterpart, have been prepared. An important characteristic of the crystalline metal aluminosilicates is their ability to undergo dehydration with little or no change in crystal structure. The dehydrated crystals are honeycombed with regularly spaced cavities interlaced by channels of molecular dimensions which offer a very high surface area for the adsorption of foreign molecules.

The basic formula for all crystalline zeolites can be represented as follows:

$$M_{2/n}O:Al_2O_3:xSiO_2:yH_2O$$

where M represents at least one replaceable cation which balances the electrovalence of the tetrahedra, $n$ represents the valence of the cation, $x$ the moles of $SiO_2$ and $y$ the moles of water. In general, a particular crystalline zeolite will have values for $x$ and $y$ that fall in a definite range.

For example, three of the commercially available synthetic varieties of crystalline metal aluminosilicate are designated as type A, type X and type Y. For type A, the value of $x$ is about 2.0; for type X, the value of $x$ is between 2 and 3, usually about 2.5; and for type Y, the value of $x$ is greater than 3. When fully dehydrated, the value of $y$ is zero.

The crystal structure of molecular sieves or crystalline metal aluminosilicates consists basically of a three-dimensional framework of $SiO_4$ and $AlO_4$ tetrahedrons. The tetrahedrons are cross-linked by the sharing of oxygen atoms, so that the ratio of oxygen atoms to the total of silicon and aluminum atoms is equal to two. The electrovalence of the tetradedrons containing aluminum is balanced by the inclusion of cations in the crystal. One cation may be exchanged for another by the usual ion-exchange techniques. The size of the cation and its position in the lattice determine the effective diameter of the pore in a given crystal species. Particularly suitable for use herein are finely divided crystalline metal aluminosilicates having a structure of rigid three-dimensional networks characterized by a system of cavities with interconnecting pore openings having a minimum diameter of 3 to 15 angstroms, the cavities being connected with each other in three dimensions by said pore openings.

The influence of various cations on the effective pore size of the molecular sieve type A is shown in the effective port diameters of the potassium ion, $K^+$, sodium ion, $Na^+$, and calcium ion, $Ca^{++}$, which are approximately 3, 4 and 5 angstroms (A), respectively.

The crystal habit of molecular sieve type X is similar to that of diamond in which the carbon atoms are replaced by silica-alumina polyhedrons. With alkali metal ions present in the structure, the effective pore diameter is 9–11 angstrom units (A). With the alkaline-earth cations present, the effective diameter is 8–9 angstrom units (A).

As found in nature or as produced synthetically, the crystalline metal aluminosilicates contain an exchangeable alkali or alkaline earth metal. Upon base exchange with an ion of a metal of Group I–B or VIII, the original alkali or alkaline earth metal of the crystalline aluminosilicate is replaced in whole or in part with the Group I–B or VIII metal cation. The Group I–B or VIII metal, as has been brought out above, is chemisorbed on the crystalline aluminosilicate and is responsible for rendering crystalline aluminosilicate catalytic to the reception of electroless metal.

A wide variety of organic cation-exchange resins may be also used to practice this invention. These are made up of three-dimensional organic networks, including charged or potentially charged groups which are neutralized by mobile ions of opposite charge. Freedom of these mobile, or counter, ions to move in and out of the resin is provided by water imbibed by the resin on immersion in an aqueous solution. The water opens the resin structure, permitting diffusion of ions into and out of the resin water (gel) phase during ion exchange.

Synthetic cation-exchange resins may be prepared by the reaction of polyhydric phenols with formaldehyde, the weakly acidic phenolic groups providing cation-exchange properties to the product. Cation-exchange resins containing strongly acidic sulfonic acid groups may be prepared by the condensation of phenols and formaldehydes in the presence of sodium sulfite.

Preferred cation-exchange resins are prepared by first forming a polymer unit of an organic resin, followed by incorporation therein of a functional ionic group. For example, the polymerization of styrene produces linear polystyrene chains. These are held together (cross-linked) by divinyl benzene to produce a network structure. Sulfuric acid groups are then attached to this network by sulfonating with concentrated sulfuric acid. Quaternary amines may be attached to the same matrix by an analogous treatment (chloromethylation of the copolymer followed by reaction with a tertiary amine).

Such base exchange resins, now by far the most popular, are offered commercially in various bead sizes (mesh) and with different porosity or cross-likning (percentage of divinylbenzene). The degree of cross-linking controls their swelling properties. The low cross-linked resins swell to many times their dry volume in aqueous solutions, while the highly cross-linked resins show little volume change.

Preferred cation-exchange resins for use in this invention are synthetic cation-exchange resins containing a functional unit which is selected from the group consisting of sulfonic, phosphonic, carboxylic, phenolic and substituted amino groups.

In preparing the catalytic particles of this invention, the initial base-exchangeable material can be contacted with a fluid medium, preferably aqueous, containing a compound of of a metal of Group I–B or VIII. The concentration of replacing cation in the fluid exchange medium may vary within wide limits. Preferably, the compound of the Group I–B or VIII metal will be present in excess, based upon the cation-exchange capacity of the base-exchangeable material.

In carrying out the treatment with the fluid exchange medium, the procedure employed comprises contacting the base-exchangeable material with the desired fluid medium until such time as the replaceable cations associated with the base-exchangeable materials are substantially removed. Elevated temperatures tend to hasten the speed of treatment whereas the duration thereof varies inversely with the concentration of ions in the fluid medium. In general, the temperatures employed range from below ambient room temperature of about 24° C. up to temperatures below the decomposition temperatures of the base-exchangeable material. Following the fluid treatment, the treated base-exchangeable material may be washed with water, preferably distilled or deionized water.

The actual procedure employed for carrying out the fluid treatment may be accomplished in a batchwise (single or multistep) or continuous method under atmospheric, subatmospheric or superatmospheric pressure. A solution of the ions to be introduced in the form of an aqueous or nonaqueous solution may be passed slowly through a fixed bed of the base-exchangeable material.

A wide variety of compounds of the metals of Group I–B or VIII may be employed as a source of replacing ions. Operable metal compounds generally include those which are sufficiently soluble in the fluid medium employed to afford the necessary ion transfer. Usually, metal salts such as the chlorides, nitrates and sulfates will be employed.

In making the catalytic compositions, a variety of techniques may be utilized. Thus, the catalytic particles could be dispersed in an organic resin and the resulting resin used to impregnate laminates, such as paper, wood, Fiberglas, polyester fibers and other porous laminates. These base materials, for example, could be immersed in a resin containing the catalytic solids or a resin containing the catalytic solids could be sprayed onto the base material, after which the base materials could be dried in an oven until all the solvent has evaporated leaving a laminate of the type described impregnated with the catalytic particles. If desired, the laminates could be bonded together to form a base of any desired thickness.

Alternatively, the catalytic solids could be dispersed in a resinous material, which is turn could be forged into a base of the desired size, as by molding.

A further alternative would be to preform or premold thin films or strips of unpolymerized resin having dispersed therein the catalytic solids, and then laminate a plurality of the strips together to form a catalytic insulating base of the desired thickness.

Using the catalytic solids described, it will be appreciated that the interior of the insulating base may be made catalytic throughout, such that, when holes or apertures are formed therein, the walls of the holes or apertures will be sensitive to the reception of electroless metal. The surface of such insulating catalytic base may or may not be catalytic, depending upon how it is made, concentration of catalytic filler, and the like. The surface could be made catalytic by mechanical means, as by mild abrasion, e.g., by sand blasting, or by chemical means, as by treatment with chemical solvents, etchants, milling solutions, and the like. A preferred chemical treatment for rendering the surface catalytic is to treat the surface with acids, preferably oxidizing acids, e.g., sulfuric, nitric, chromic and the like. Alternatively, the exposed surface or surfaces of the catalytic bases could be made catalytic by coating them with a thin film of an adhesive or ink having dispersed therein the catalytic fillers described herein.

Catalytic solids of the type described could also be incorporated into a resin during its manufacture in the form, for example, of a molding powder. The molding powder could then be extruded or otherwise worked to form a plastic article which would be catalytic.

The catalytic insulating base need not be organic. Thus, it could be made of inorganic insulating materials, e.g., inorganic clays and minerals such as ceramic, ferrite, carborundum, glass, glass bonded mica, steatite and the like. Here, the catalytic agent would be of the inorganic type described hereinabove, and would be added to inorganic clays or minerals prior to firing.

The term "catalytic" as used herein refers to an agent or material which is catalytic to the reduction of the metal cations dissolved in electroless metal deposition solutions of the type to be described. The amount of catalytic agent used in the bases and adhesive resins described will vary depending upon the agent and the form in which it is used from about 0.001 to 80%, usually between about 0.1 to 50%, based upon the combined weight of base material or adhesive resin and catalyst.

Among the organic materials which may be used to form the catalytic insulating bases and adhesives described herein may be mentioned thermosetting resins, thermoplastic resins and mixtures of the foregoing.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate and the like; chlorinated polyethers; nylon; polyethylene; polypropylene; polystyrene; styrene blends, such as acrylonitrile styrene copolymer and acrylonitrile-butadiene-styrene copolymers; polycarbonates; polyphenyloxide; polysulfones; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal.

Among the thermosetting resins may be mentioned allyl phthalate; furane; melamine-formaldehyde; phenol formaldehyde and phenol-furfural copolymer, alone or compounded with butadiene acrylonitrile copolymer or acrylonitrile-butadiene-styrene copolymers; polyacrylic esters; silicones; urea formaldehydes; epoxy resins; allyl resins; glyceryl phthalates; polyesters; and the like.

For the manufacture of printed circuits, the catalytic adhesive will ordinarily comprise a flexible adhesive resin, alone or in combination with thermosetting resins of the type described. Typical of the flexible adhesive resins which may be used in such a system are the flexible adhesive epoxy resins, polyvinyl acetal resins, polyvinyl alcohol, polyvinyl acetate, and the like. Preferred for use as the adhesive resin are natural and synthetic rubber, such as chlorinated rubber, chlorosulfonated polyethylene butadiene acrylonitrile copolymers, and acrylic polymers and copolymers.

The adhesive resins of the type described have appended thereto polar groups, such as nitrile, epoxide, acetal and hydroxyl groups. Such adhesive resins copolymerize with and plasticize any thermosetting resins which may be present in the system, and alone or in combination with thermosetting resins impart good adhesive characteristics through the action of the polar groups.

The catalytic adhesives will comprise an adhesive resin of the type described having dissolved therein, or dispersed therein one or more of the catalytic agents of the type described hereinabove.

Typical of the electrodes copper solutions which may be used are those described in U.S. Pat. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH adjusor, e.g., sodium hydroxide.

Typical electroless nickel baths which may be used are described in Brenner, "Metal Finishing," November 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 15, and the ion ratio of hypophosphite and radical to insoluble gold salt may be between about 0.33 and 10:1.

Specific examples of electroless copper depositing baths suitable for use will now be described:

EXAMPLE 1

| | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C. and will deposit a coating of ductile electroless copper about 1 mil thick in about 51 hours.

Other examples of suitable baths are as follows:

EXAMPLE 2

| | Moles/liter |
|---|---|
| Copper sulfate | 0.02 |
| Sodium hydroxide | 0.05 |
| Sodium cyanide | 0.0002 |
| Trisodium N-hydroxyethylethylenediaminetriacetate | 0.032 |
| Formaldehyde | 0.08 |
| Water | Remainder |

This bath is preferably operated at a temperature of about 56° C., and will deposit a coating of ductile electroless copper about 1 mil thick in 21 hours.

EXAMPLE 3

| | Moles/liter |
|---|---|
| Copper sulfate | 0.05 |
| Diethylenetriamine pentaacetate | 0.05 |
| Sodium borohydride | 0.009 |
| Sodium cyanide | 0.008 |
| pH | 13 |

Temperature: 25° C.

EXAMPLE 4

| | Moles/liter |
|---|---|
| Copper sulfate | 0.05 |
| N-hydroxyethylethylenediaminetriacetate | 0.115 |
| Sodium cyanide | 0.0016 |
| Sodium borohydride | 0.008 |
| pH | 13 |

Temperature: 25° C.

Utilizing the electroless metal baths of the type described, very thin conducting metal films may be laid down. Ordinarily, the metal firms superimposed by electroless metal deposition will range from 0.1 to 7 mils in thickness, with metal films having a thickness of even less than 0.1 mil being a distinct possibility.

The following examples illustrate the manner in which the catalytically active compositions of this invention may be produced.

EXAMPLE 5

A molecular sieve, type 4A, was repeatedly base-exchanged with an aqueous solution of silver chloride until base-exchange was substantially complete, as evidenced by a refusal of the sieve to take up any additional amount of silver. Following base-exchange, the sieve was thoroughly washed with water and dried at a temperature of about 200° C. The silver-exchanged 4A sieve was incorporated into a polyester resin having the following formulation:

Polyester resin (Laminac 4128)—20 grams
Benzoyl peroxide—0.6 gram
Kaolin (ASP 405)—10 grams
Dimethyl aniline—1 drop
Molecular sieve type 4A base-exchanged with silver—0.05 gram A casting was made, and holes drilled in the casting, following which the casting was immersed in the following electroless copper solution:

Copper sulfate—0.06 mole/liter
EDTA—0.12 mole/liter
Formaldehyde—0.08 mole/liter
Sodium cyanide—0.5 millimole/liter
pH (adjust with NaOH)—12
Temperature—57°
Wetting agent—1 gram/liter After 60 minutes, copper deposited on the walls surrounding the holes drilled in the casting.

When the amount of catalytic filler was increased, the time for initiating copper plating decreased as follows:

| Amount of silver chloride base-exchanged 4A resin. grams: | Time to cover walls surrounding holes with electroless copper, minutes |
|---|---|
| 0.5 | 30 |
| 1.0 | 15 |
| 2.5 | 5–10 |

EXAMPLE 6

Twenty (20) grams of a synthetic ion-exchange resin, Amberlite IR–120, was exchanged with an aqueous solution containing 8.5 grams of silver nitrate until base-exchange was substantially complete, as evidenced by a refusal of the resin to take up any additional amount of silver. The resin following base-exchange was dried and ground. Amberlite IR–120 is a polystyrene base, high capacity, sulfonic acid type cation-exchange resin, which is strongly acidic. The following casting was then prepared:

| | Grams |
|---|---|
| Polyester resin (Laminac 5128) | 20 |
| Benzoyl peroxide | 0.5 |
| Kaolin (ASP 405) | 9 |
| Silver-exchanged Amberlite IR–120 | 1 |

The walls of holes drilled in the resulting casting received a deposit of electroless copper when the casting was immersed in an electroless copper deposition solution described in Example 5, thereby indicating that the casting was catalytically active.

EXAMPLE 7

Example 6 was repeated with the exception that the ion-exchange resin used was Amberlite IRA–400, which was exchanged with a solution of palladium chloride instead of silver nitrate. Amberlite IRA–400 is a polystyrene base, quarternary amine type cation-exchange resin which is strongly basic.

The palladium exchanged Amberlite resin was incorporated in a polystyrene resin composition having the formulation described in Example 6 and castings made therefrom.

The amount of palladium exchanged Amberlite in the casting formulation was 1 gram. Holes were drilled in the resulting casting and the casting immersed in an electroless copper deposition solution of the type described in Example 5. The walls of the holes received a deposit of copper in less than ½ hour, thereby indicating that the casting was catalytically active.

The catalytic agents described herein may be used in a variety of ways as already brought out. For example, they could be dispersed through an insulating material to render catalytic the interior as well as the surface of the insulating material. Thus, if holes were drilled in the resulting substrata, electroless metal would deposit on the walls surrounding the holes, since the entire interior of the substratum, as well as the surface, would be catalytic.

The catalytic agents could also be incorporated into a suitable composition to be used as an ink to paint the surface areas on which electroless metal is to be deposited.

The insulating base members on which electroless metal is to be deposited are most frequently formed of resinous material. When this is the case, the catalytic agents disclosed herein could be dispersed into a resin after which the resin could be set to form the base. Alternatively, a thin film or strip of unpolymerized resin having dispersed therein the catalytic solids of this invention could be preformed or premolded, and then laminated to a resinous insulating base. and cured thereon. In this embodiment, the insulating base could for example be made up of laminates, e.g., resin impregnated paper sheets, resin impregnated Fiberglas sheets, and the like.

In a still further embodiment, a resinous ink having the catalytic agent dispersed therein could be printed on the surface, as by silk screen printing, of an insulating support and cured thereon.

A particularly important embodiment of the invention is that wherein the catalytically active solids are dispersed in a resin which may in turn be formed into a three-dimensional object, as by molding. In this embodiment, the entire composition including the interior is catalytic. When such an article, containing apertures extending below the surface thereof, is subjected to an electroless metal deposition solution, electroless metal deposits not only on the exposed portions of the surface of the article, but also on the walls surrounding the apertures. This embodiment is especially suitable for making printed circuit patterns having plated through holes, i.e., holes having surrounding walls which are plated with metal to form through connections between a surface supporting a printed circuit pattern, and the interior of the substratum supporting the circuit pattern. Alternatively, in making printed circuits from the molded embodiment of the invention, interconnecting holes could be bored into the catalytically active article, and then the article subjected to an electroless metal deposition. to thereby deposit metal on the walls surrounding the holes. Following electroless metal deposition, the interconnecting holes, which are now metallized, form a conducting pattern which may be limited to the interior portion of the article.

Using the catalytic agents of the present invention, printed circuits may be made by employing either the direct or reverse printing technique, since the agents are nonconducting.

To summarize, the catalytic agents of this invention could be used as additives to render photoresists sensitive to electroless metal deposition; as an impregnant for resinous compositions to be metallized; as impregnants for porous plastics to be metallized; as impregnants for ceramics or clays to be metallized, etc.

Following the teachings contained herein there may be provided a blank for the manufacture of printed circuits which comprises an insulating base material which has dispersed therein the catalytic agents described herein. In a preferred embodiment, a thin metal film is superimposed on one or more surfaces of the base and adhered thereto. Blanks of the type described could be used to prepare one-layer, two-layer and multilayer printed circuit boards with and without plated through holes in the manner more particularly described in copending application Ser. No. 561,123, filed June 28, 1966.

Figure 1:
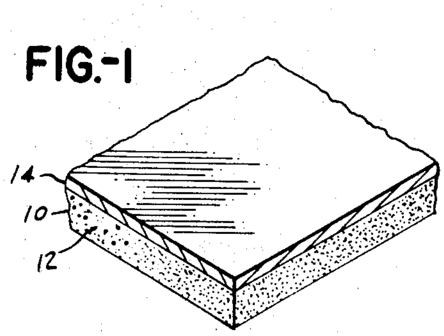
FIGS. 1 and 2 are three-dimensional views of certain embodiments of the blanks of this invention.
Figure 2:
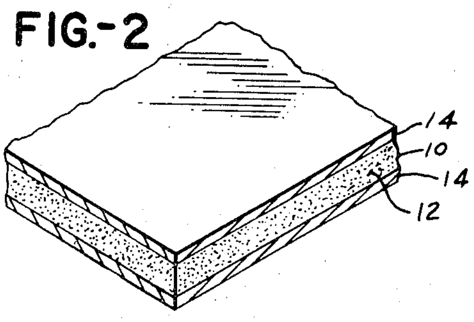
Figure 3:
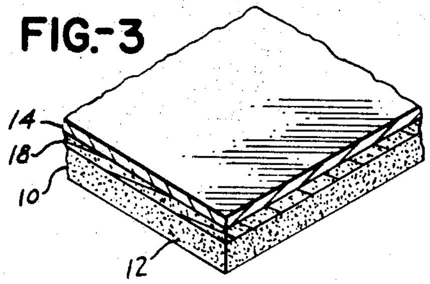
FIGS.3 and 4 are cross-sectional views of further embodiments of the catalytic blanks of this invention.
Figure 4:
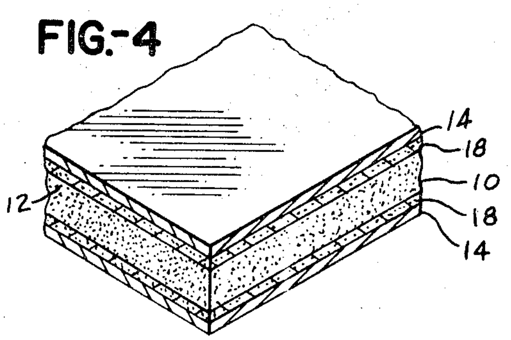
Figure 6:
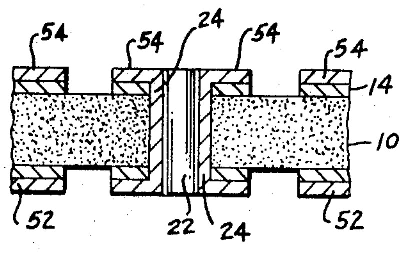
Figure 7:
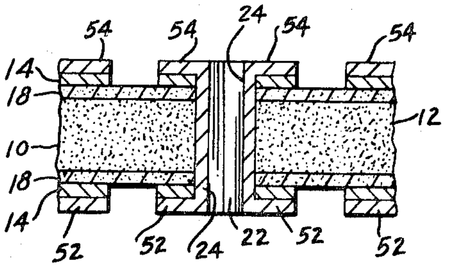
Figure 8:
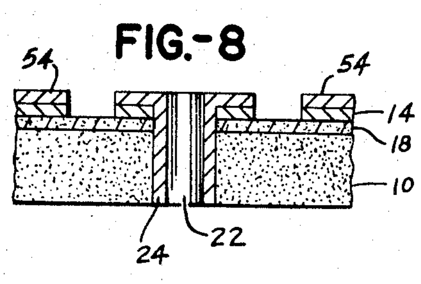
Figure 5:
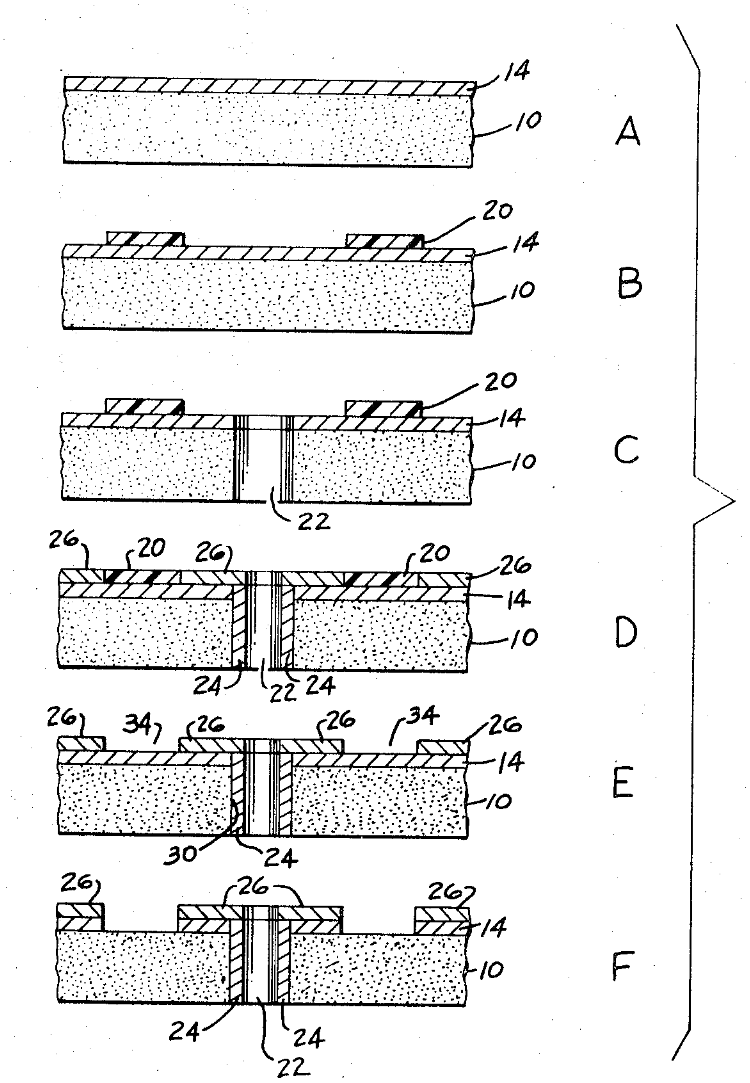

FIG. 5, A–F, is a schematic illustration of the steps utilized in making a one-sided printed circuit board from the blank of FIG. 1;

FIGS. 6 and 7 are cross-sectional views of typical embodiments of two-sided plated through hole printed circuit boards produced in accordance with this invention utilizing the blanks of FIGS. 2 and 4, respectively; and FIG. 8 is a cross-sectional view of a one-sided plated through hole circuit board manufactured from the blank of FIG. 3;

In FIG. 1 is shown a blank which comprises, in its simplest form, an insulating base 10 having distributed therein an agent of the type described which is catalytic to the reception of electroless metal from an electroless metal deposition solution. Hereinafter whenever the term "catalytic" is employed it will refer to catalytic agents of the type described hereinabove.

The catalytic agent 12 may be dispersed throughout the base 10 to render the base catalytic to the reception of electroless metal. Superimposed on the base 10 and adhered thereto is a thin unitary and integral metal film or laminate 14 which preferably covers and is substantially conterminous with, i.e., has the same boundaries as, the surface of base 10. The thickness of the metal film 14 will depend primarily upon the manner in which it is fabricated and bonded to the base 10, and will also depend upon the ultimate use to which the blank is to be put. Typically, the metal film will have a thickness of between about 0.05 micron and 105 microns. In a preferred embodiment, the metal film 14 is copper. The thickness of the metal film 14 when made of copper will preferably be such that its weight will vary between about 0.03 and 2 ounces per square foot.

When the metal film 14 is superimposed on the base 10 by means of conventional metal cladding techniques, i.e., by pre-forming a thin foil of metal, e.g., by electrolytic deposition, and laminating it to the base, the foil 14 will have a thickness of at least about 17 microns. On the other hand, if the metal film is produced by vapor deposition or by the electroless chemical metal deposition technique described herein, it can be as thin as 0.05 micron.

In accordance with a preferred embodiment of the present invention, the film 14 is produced by electroless metal deposition, preferably electroless copper deposition, and has a thickness of between about 0.05 and 30 microns, preferably between about 0.1 and 10 microns. Thin films of the type disclosed having a thickness of less than 5 microns and preferably between 2 and 4 microns, have the ability to be quick etched, as described hereinbelow.

In FIG. 2, there is shown an embodiment of the blank which comprises an insulating member 10 containing a catalytic agent 12. Adhered to both surfaces of the base are thin unitary metal films 14.

FIGS. 3 and 4 illustrate modified embodiments of the blank shown in FIGS. 1 and 2. Thus, in FIG. 3 the catalytic base 10 has superimposed thereon an insulating adhesive resin 18 which is itself catalytic to the reception of electroless metal. The adhesive resin 18 has dissolved therein or dispersed therein a catalytic agent. Alternatively, the adhesive resin 18 may be formed in whole or in part of an insulating organo-metallic compound which is itself catalytic to the reception of electroless metal. The thin layer of metal 14 is adhered to the base 10 by the catalytic adhesive 18.

Similarly, in FIG. 4, the catalytic base 10 is coated on both surfaces with an adhesive 18, which is catalytic, and thin metal films 14 are adhered to both surfaces of base 10 by the adhesive 18.

When certain forms of catalytic agent, e.g., solid particles, are used to prepare the catalytic base 10, there is a tendency for the surface layers of the base 10 to be rich in resin and low in catalyst. As a result, depending upon how the base 10 is manufactured, it sometimes happens that the surface of the base is noncatalytic, even though the interior of base 10 is highly catalytic. This situation is remedied by coating one or both surfaces of the base 10 with a catalytic adhesive 18, as shown in FIGS. 3 and 4. Alternatively, such surfaces could be rendered catalyically active by treatment with acids. Especially suitable are oxidizing acids such as sulfuric, nitric and chromic acids, including mixtures of the foregoing. Treatment with such acids not only renders the surface catalytically active, but it also frequently serves to considerably enhance the bond between the surface and electroless metal deposited thereon.

FIG. 5 illustrates the steps to be used in the manufacture of a one-sided plated through hole board from the blank shown in FIG. 1.

FIG. 5A illustrates the starting blank comprising a catalytic base 10 having a thin metal film 14 adhered to the upper surface. The thin metal film may but need not be conterminous with the upper surface.

In FIG. 5B, a negative resin mask 20 has been printed onto the metal foil 14 to leave exposed a positive pattern of the desired printed circuit. At C, FIG. 5, a hole 22 has been provided as by punching or drilling through the foil 14 and base 10, at an interconnecting point of the desired circuit. The blank as it appears in FIG. 5C is then immersed in an electroless metal plating bath of the type described herein to deposit metal 26 on the wall 30 of hole 22. Additional metal 26 deposits on the surface of the metal film 14 which is not covered by the mask 20. If desired, an electrode may be attached to the board after the wall 24 has been formed by electroless deposition, and the circuit pattern and hole walls built up by conventional electrolytic deposition of metal. Following buildup of the circuit to desired thickness either by electroless or electrolytic deposition, the blank is treated with a suitable solvent to remove the mask 20. The blank, following removal of the mask 20, is depicted in FIG. 5E. Finally, the panel is subjected to an etching solution, e.g., ferric chloride, ammonium persulfate, and the like, when the metal film 14 is copper, to thereby remove the thin film of copper 34 which was initially covered by the mask 20. Note that if the metal film 14 is thin, e.g., less than 5 microns, there will be no need to mask the circuit pattern 26 or the plating 24 on the hole walls 30 during the etching step, because the film of metal 14 is so extremely thin compared with the circuit pattern 26 that it will be removed before any substantial etching of circuit 26 or plated wall 24 occurs. Of course, if the initial metal film 14 is thick, the circuit 26 and wall 30 will have to be masked prior to the etching operation.

The etching operation may be carried out by either blasting the surface of the panel with a fine spray of etchant solution or by immersing the panels, which are held in a rack or on a conveyor, in an agitated tank of etchant. During etching, the concentration of the etching solution and the time of contact will be controlled to insure complete removal of the thin layer of copper foil in the area 34. After etching, the panel should be water rinsed to remove all etching chemicals to thereby prevent contamination of the surface or edges of the panels. If desired, the circuit pattern may be plated with additional metals, such as silver, nickel, rhodium, gold or similar high wear resistant materials for special applications. When it is necessary to solder lugs or other hardware to the pattern, it is advisable to solder plate the conductive pattern.

The procedure described above and illustrated in FIG. 5 may also be used to prepare a two-sided, plated through hole printed circuit board of the type shown in FIG. 6, starting with a blank of the type shown in FIG. 2. As shown in FIG. 6, the circuit board comprises a catalytic base 10 having circuit patterns 52 and 54 superimposed on the lower and upper surfaces, respectively. Through connections between the circuit patterns is provided by hole 22, the lateral wall of which is coated with metal 24.

The one-sided plated through hole board of FIG. 8 is prepared by applying the technique illustrated in FIG. 5 and described above to the blank of FIG. 3.

Likewise, the two-sided plated through hole board shown in FIG. 7 is prepared by applying the procedure of FIG. 5 to the blank shown in FIG. 4. In FIG. 7, circuits 52 and 54 on the lower and upper surfaces, respectively, of catalytic base 10 are connected via plated through hole 22, the lateral walls of which are coated with electroless metal 24.

Preferably, in those embodiments of the invention calling for a catalytic adhesive 18, the adhesive will take the form of a flexible adhesive resin of the type described hereinbelow. The flexible adhesive resins which are catalytic to the reception of electroless metal and are also insulating in nature, insure a strong reliable bond between the circuit pattern and the catalytic insulating base.

As will be appreciated from the foregoing, all of the blanks described herein may be used to form metallized insulating substrates directly on insulating base materials without the necessity of seeding the insulating material prior to metallization.

A distinct advantage of these blanks in printed circuit manufacture is that they can be used to produce directly rugged and reliable printed circuit boards having plated through holes. Use of such blanks eliminates the preseeding and/or presensitizing steps of conventional practice together with the concomitant problems associated with such practice.

Catalytic insulating bases containing noncatalytic surfaces may be made in a variety of ways. Thus, the catalytic insulating base could be made with a minimal amount of catalytic agent to insure that the surface of the base is extremely rich in insulating and extremely poor in catalyst. When formed, such a base, or laminates impregnated with such a base, will have surfaces which are substantially noncatalytic to the deposition of electroless metal.

Alternatively, a catalytic insulating base rich in catalyst could be prepared and one or both surface thereon then coated with a noncatalytic insulating film or adhesive. For example, when the catalytic base is made by impregnating paper or fibrous substrata, e.g., Fiberglas, with catalytic resin, a final gel coat of noncatalytic resin could be superimposed on the laminated structure during manufacture to produce the noncatalytic surface. Alternatively, a film of noncatalytic resin could be bonded to the substrata following completion of lamination.

In the manufacture of the catalytic base materials and adhesives described, an agent which is catalytic to the reception of electroless metal is distributed throughout an insulating base or adhesive, as by dispersion. The resulting base or adhesive will be catalytic to the reception of electroless metal throughout its interior.

Exposed surfaces of the catalytic base materials of this invention are catalytic to the reception of electroless metal, or may be rendered catalytic by subjecting the surface to relatively mild mechanical or chemical abrasion or etching or by coating the surface with catalytic adhesives of the type described.

A film of metal as shown in FIGS. 1–4, accordingly, may be readily superimposed on such a base simply by immersing the base in an electroless metal deposition solution of the type to be described. Alternatively, the catalytic base could actually be clad with a thin metal foil, using typical metal cladding or lamination techniques, e.g., by bonding a thin foil of metal to the base.

A printed pattern may be formed on the metal-clad blanks of this invention in a variety of ways. In the so-called photographic technique, the surface is cleaned and degreased, and a light sensitive enamel is uniformly spread over the metal foil and dried.

The photographic system of printing could also be used to produce the mask in the additive process for producing a circuit pattern by electroless metal deposition techniques described hereinabove. Whenever required, the light sensitive enamel could be made catalytic to the reception of electroless metal by dissolving or dispersing therein an agent which is catalytic to the reception of electroless metal.

For long production runs, the photographic system of printing tends to be slow and expensive, and as a result, etch resist printing will ordinarily be carried out either by offset printing on an offset printing press or by screen stencil printing on a manual or automatically operative screen printing press. The step and repeat negative is used to produce, in the case of an offset printing press, an offset printing plate. Acid resist ink is transferred by a rubber covered roll from the printing plate to the metal clad base.

In screen printing, the step and repeat negative is used to produce a stencil on the silk or wire mesh of the screen frame. The stencil is made photographically from the negative and reproduces it exactly.

Regardless of the type of printing employed, it will be understood that either a positive or a negative image of the desired conducting patterns may be imposed on the base, with suitable modifications to insure that the final conductive pattern desired is ultimately obtained.

When offset or screen stencil printing is employed, the ink used in printing is acid resistant, so that the portions of the metal foil covered thereby are not affected by the etching solution when the plate is contacted therewith. Such acid resistant inks are well understood in the art, and commonly comprise resins such as cellulose acetate, cellulose butyrate, casein-formaldehyde, styrene-maleic anhydride, and the like. Such materials are acid resistant but can be readily removed when desired by readily available solvents or otherwise.

One etching solution commonly used with copper clad stock is ammonium persulfate. The etching operation is carried out by either blasting the surface of the panel with a fine spray of ammonium persulfate or immersing the printed sheets, which are held in a rack or on a conveyor, in an agitated tank of ammonium persulfate. The etching operation is controlled by the concentration of the etching solution and time of contact, and these variables must be carefully controlled empirically for good results. After etching, a water rinsing process is employed to remove all etching chemicals, thereby preventing contamination of the surface or edges of the panel.

Frequently, a bare copper foil circuit is not adequate. If, for example, the circuit pattern is to be used as a switch, slip ring, or commutator, it may be necessary to plate the circuit pattern with silver, nickel, rhodium, gold and similar highly wear resistant metals. Where it is necessary to solder lugs or other hardware to the pattern, it may be advisable to have the conductor pattern solder plated.

It will be understood that in the metal clad or otherwise metal coated blanks of the type described in FIGS. 1–4, and referred to throughout the specification, the metal layer may be any of the well known conductive metals, including copper, silver, gold, nickel, rhodium, aluminum and the like, including mixtures or alloys of such metals. Copper, aluminum, nickel and silver are particularly preferred.

For metallization of plastics, as distinguished from printed circuit manufacture, a preferred blank consists of an inexpensive insulating base whose interior is noncatalytic, having a catalytic gel or other type of catalytic coating on one or both surfaces. The catalytic skin or coating could be molded or extruded on one or both surfaces of the insulating noncatalytic base. When necessary, such an article could be treated to activate the catalytic surface portion, such as by treatment with an oxidation or degradation agent, such as sulfuric acid, chromic acid, permanganate, and the like. Particularly suitable is an aqueous mixture of sulfuric and chromic acid. Treatment with such materials produces micropores in the surface of the catalytic film or layer, and exposes the catalyst for contact with an electroless metal deposition solution. Such micropores also enhance the adhesion between the catalytic base and the electroless metal deposited thereon. The electroless metal may be electroless copper, electroless nickel, electroless silver, electroless gold, or the like. Use of this blank accordingly would result in the economical production of metallized plastic articles, since the costly catalytic agents described herein need to be used only in thin surface films or layers on a surface or surfaces of the articles.

Such articles could be manufactured for example by an extrusion process. Here, the catalytic material could be extruded simultaneously as a skin over an insulating, noncatalytic base. Alternatively, a molding process could be employed wherein the catalytic film could be separately or simultaneously molded over an insulating noncatalytic base. In articles of this type, the insulating base and the skin or surface film could either be the same as or a different resin system. When the base and the skin portions are made of the same resin system, there is no distinction and no discontinuity between the catalytic and noncatalytic portions of the molded or extrusion base. The noncatalytic, insulating core of the articles under discussion is preferably made of cheap, readily available resins or plastics, such as acrylonitrile-butadiene-styrene (ABS), polyesters, phenolics such as phenol formaldehyde, and the like. Obviously, however, the insulating base could be any of the resins described hereinabove as suitable for producing insulating blanks. Similarly, the catalytic film or layer could be any such resins or resin systems described hereinabove having dispersed therein a catalytic agent of the type described. The catalytic film or layer could, for instance, correspond to the resin formulations given in any of the preceding examples.

It should also be brought out that inks containing the catalytic agents described herein could be used to produce printed circuit patterns by printing a positive design of the pattern on noncatalytic surfaces, and then subjecting the base to electroless metal deposition. These catalytic agent containing inks have the advantage of being nonconducting, as already brought out.

What is claimed is:

1. A three-dimensional article comprising an inculating material having dispersed therein a catalytic filler, which comprises inert, finely divided solid particles of a base exchangeable material which contains a cation of a metal selected from Groups I-B and VIII of the Periodic Table of Elements, such metal cation being chemisorbed on the exchangeable material in place of replaceable cations present in such material, both the surface and interior portion of said article being catalytic to the deposition of electroless metal, at least a surface portion of said article having adhered thereto a thin film of metal.

2. The article of claim 1 wherein the thin metal film is a thin film of electroless metal.

3. A three dimensional article comprising an insulating material having dispersed therein a catalytic filler, which comprises inert, finely divided solid particles of a base exchangeable material which contains a cation of a metal selected from Groups I–B and VIII of the Periodic Table of Elements, such metal cation being chemisorbed on the exchangeable material in place of replaceable cations present in such material, said article being provided with an aperture extending from one surface into the interior, the lateral walls surrounding the aperture being catalytic to the deposition of electroless metal.

4. The article of claim 3 wherein at least a surface portion of said article has adhered thereto a thin film of metal.

5. The article of claim 4 wherein the thin metal film is a thin film of electroless metal.

6. A three-dimensional article comprising an insuating base, the interior of which is noncatalytic to the reception of electroless metal, said base having a surface layer which is catalytic to the reception of electroless metal, the catalytic properties of said layer being attributable to the presence therein of a catalytic filler, which comprises inert, finely divided solid particles of a base exchangeable material which contains a cation of a metal selected from Groups I–B and VIII of the Periodic Table of Elements, such metal cation being chemisorbed on the exchangeable material in place of replaceable cations present in such material.

7. The article of claim 6 wherein the base comprises acrylonitrile-butadiene-styrene resin.

8. As a new article of manufacture, an insulating base having incorporated therein a catalytic filler which comprises inert, finely divided solid particles of a base exchangeable material which contains a cation of a metal selected from Groups I–B and VIII of the Periodic Table of Elements, such metal cation being chemisorbed on the exchangeable material in place of replaceable cations present in such material.

9. The article of claim 8 wherein the insulating base is an insulating molded resin substrate, the interior portion of which is catalytic to the reception of electroless metal.

10. The article of claim 8 wherein the insulating composition is an organic resinous material comprising a member selected from the group consisting of thermosetting resins, thermoplastic resins and mixtures of the foregoing.

11. The article of claim 8 wherein the insulating base comprises, in combination, a thermosetting resin and a flexible adhesive resin.

12. The article of claim 8 wherein the insulating composition is a photoresist.

13. The article of claim 8 wherein the insulating composition is a resinous ink.

14. The article of claim 8 wherein the insulating composition is provided with a thin film of metal on at least one surface thereof.

15. The article of claim 8 wherein the insulating composition is provided with an aperture extending from at least one surface into the interior thereof, the walls of said aperture being receptive tothe reception of electroless metal upon contact of the walls with an electroless metal deposition solution.

16. The article of claim 8 wherein said base-exchangeable material is present in an amount of between about 0.001 and 70% by weight of the insulating composition.

17. The article of claim 8 wherein the insulating base contains a resin having one or more of the following functional groups: primary amino groups (—NH), secondary amino groups (>NH), tertiary amino groups (>N—), imino groups (=NH), carboxyl groups (—COOH), hydroxyl groups (—OH), aldehyde groups (—CHO), ketone groups (C=O), ether groups (—C—O—C—), halogen groups (—X) and sulfoxyl groups (SO).

18. The article of claim 8 wherein the insulating composition is an inorganic insulating composition, and wherein the base-exchangeable material is an inorganic base-exchangeable material.

References Cited

UNITED STATES PATENTS

| | | | |
|---|---|---|---|
| 3,171,756 | 3/1965 | Marshall | 117—212 |
| 3,259,559 | 7/1966 | Schneble et al. | 117—213 |

WILLIAM L. JARVIS, Primary Examiner

U.S. Cl. X.R.

106—1; 117—213; 174—685; 252—410, 431, 472; 260—596

PO-1050
(5/69)

UNITED STATES PATENT OFFICE
CERTIFICATE OF CORRECTION

Patent No. U.S. 3,546,009 Dated December 8, 1970

Inventor(s) Frederick W. Schneble, Jr., et al

It is certified that error appears in the above-identified patent and that said Letters Patent are hereby corrected as shown below:

Col. 1, lines 54-55, "sinsitize" should read -- sensitiz Col. 2, line 48, "substream" should read -- substratum --; Col. 5, line 3, "cross-likning" should read -- cross-linking Col. 5, line 65, "is" should read -- in --; Col. 7, line 7, "electrodes" should read -- electroless --; Col. 7, line 14, "adjusor" should read -- adjustor --; Col. 8, line 11, "firms should read -- films --; Col. 14, line 68 "inculat-" should r --insulat- --; Col. 15, line 22, "insuating" should read -- insulating --; and Col. 16, line 19, "tothe" should read -- to the --.

Signed and sealed this 8th day of June 1971.

(SEAL)
Attest:

EDWARD M.FLETCHER,JR.
Attesting Officer

WILLIAM E. SCHUYLER,
Commissioner of Paten